(12) United States Patent
Alsadah et al.

(10) Patent No.: US 9,876,133 B2
(45) Date of Patent: Jan. 23, 2018

(54) PHOTOVOLTAIC SYSTEM FOR SPECTRALLY RESOLVED SOLAR LIGHT

(71) Applicant: King Fahd University of Petroleum and Minerals, Dhahran (SA)

(72) Inventors: Jihad Hassan Alsadah, Safwa (SA); Nouar Amor Tabet, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 277 days.

(21) Appl. No.: 14/462,648

(22) Filed: Aug. 19, 2014

(65) Prior Publication Data

US 2016/0056756 A1    Feb. 25, 2016

(51) Int. Cl.
*H01L 31/054* (2014.01)

(52) U.S. Cl.
CPC ...... *H01L 31/0549* (2014.12); *H01L 31/0547* (2014.12); *Y02E 10/52* (2013.01)

(58) Field of Classification Search
CPC .. H02S 40/22; H01L 31/0547; H01L 31/0549
USPC .......................................................... 136/259
See application file for complete search history.

(56) References Cited

U.S. PATENT DOCUMENTS

| | | | | |
|---|---|---|---|---|
| 4,361,717 A | * | 11/1982 | Gilmore | F24J 2/07 136/246 |
| 5,180,441 A | * | 1/1993 | Cornwall | F24J 2/14 136/246 |
| 2007/0289622 A1 | * | 12/2007 | Hecht | H01L 31/055 136/246 |
| 2008/0142076 A1 | * | 6/2008 | Horne | F24J 2/18 136/259 |
| 2009/0229651 A1 | | 9/2009 | Fay, Jr. | |
| 2011/0186108 A1 | * | 8/2011 | Liu | H01L 31/035281 136/246 |
| 2011/0220175 A1 | | 9/2011 | Haney et al. | |
| 2012/0057324 A1 | | 3/2012 | Martinez | |
| 2014/0102510 A1 | * | 4/2014 | Kalus | F24J 2/14 136/246 |

OTHER PUBLICATIONS

U.S. Appl. No. 14/324,778, filed Jul. 7, 2014, Alsadah, et al.

* cited by examiner

*Primary Examiner* — Tae-Sik Kang
(74) *Attorney, Agent, or Firm* — Oblon, McClelland, Maier & Neustadt, L.L.P.

(57) ABSTRACT

A photovoltaic system is described that improves solar energy absorption efficiency by resolving light into constituent colors using dispersive optics. The system reduces a blurring effect of a light beam while ensuring that the system's bulkiness is not increased. The photovoltaic system disperses a focused light beam into constituent colors (spectrum) and provisions for sufficient expansion of the light beam. The photovoltaic system re-focuses the dispersed light beam that results in a reduction of the beam size, while the beam is being exposed to photovoltaic cells that convert the incident light energy into electrical energy.

10 Claims, 5 Drawing Sheets

PHOTOVOLTAIC SYSTEM FOR SPECTRALLY RESOLVED SOLAR LIGHT

BACKGROUND

Field of Disclosure

Embodiments described herein generally relate to improving energy efficiency of a photovoltaic system. Specifically, a photovoltaic system and a method of operation thereof is provided that resolve solar light into various color components and absorb the resolved colors into different materials optimized for those color bands.

Description of the Related Art

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Solar energy proves to be a good source of natural energy from which electrical energy can be obtained via a photovoltaic system. Typically, a photovoltaic system includes a solar cell (also called a photovoltaic cell) that is an electrical device that converts the energy of light directly into electricity. Typical photovoltaic systems may achieve high energy conversion efficiency by incorporating an array of expensive solar cells such as multi-junction solar cells. To reduce the cost overhead incurred in constructing such a system, the photovoltaic system may include low-cost solar cells. However, the overall efficiency of such a photovoltaic system is low, and typically unacceptable in various applications.

An optically concentrated photovoltaic system (CPV) can reduce costs of solar cells by focusing the incoming light on a smaller area of photovoltaic material. In an effort to improve the energy conversion performance of a photovoltaic system, multi-junction solar cells can be used that achieve an overall efficiency exceeding 40%. Multi-junction solar cells are solar cells with multiple p-n junctions made of different semiconductor materials. Each material's p-n junction will produce an electric current in response to a different range of wavelength of sunlight. A multi junction solar cell produces electric current at multiple wavelengths of light, and allows the minimization of the energy losses via thermalization process of the photo-generated carriers, thereby increasing the energy conversion efficiency of this device. However, the construction of such a multi junction solar cell is complex/costly, as multiple solar cells need to be stacked one on top of each other. Specifically, the fabrication process of a multi junction solar cell is complex because the crystalline structures of the different semi-conductor materials used in the stacked layers of the multi junction cell need to be matched. Furthermore, multi junction solar cells also face the problem of providing cooling to the stack of vertically mounted solar cells. In addition, the vertically stacked cells must produce the same current (current matching) which compromises the achievable efficiency. Accordingly there is a requirement for an improved photovoltaic system that achieves high efficiency in terms of energy conversion, whilst keeping the system cost low.

SUMMARY

The present disclosure describes a photovoltaic system that resolves light into its constituent colors and absorbs them onto series of single junction photovoltaic cells. Specifically, the photovoltaic system disperses a focused and collimated light beam into constituent colors and provides for sufficient geometric expansion of the dispersed light beam. Further, the photovoltaic system re-focuses the dispersed light beam to reduce the beam size, while the beam is exposed to photovoltaic cells. The photovoltaic cells convert the incident light energy into electrical energy.

Accordingly, an aspect of the present disclosure provides a photovoltaic system including a concentrator configured to receive light and focus the received light at a focus point of the concentrator; a first collimator configured to convert the focused light into a parallel beam of light; a transmission dispersive optic configured to spectrally split the parallel beam of light into constituent wavelengths; a reflector configured to re-focus and reduce a cross sectional area of the resolved and expanding beam of light; and single-junction photovoltaic cells configured to absorb the re-focused beam of light and convert the absorbed light into electrical energy.

According to another embodiment of the present disclosure is provided a method of photovoltaic energy conversion. The method including: receiving by a concentrator, light from a light source and focusing the received light at a focus point of the concentrator; converting by a collimator, the focused light into a parallel beam of light; splitting spectrally by a reflective dispersive optic, the beam of light into constituent wavelengths; refocusing and reducing by a reflector, a cross sectional area of the constituent wavelengths of the parallel beam of light; and absorbing by a single-junction photovoltaic cell the re-focused beam of light and converting the absorbed light into electrical energy.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

In a solid-state semiconductor, a solar cell is made from two doped crystals, one an n-type semiconductor, which has extra free electrons, and the other a p-type semiconductor, which is lacking free electrons. When placed in contact, a region is formed at the interface, known as the space charge region of the p-n junction. This electric field depletes the space charge region from free carriers and is associated with a potential barrier of about 0.6 V to 0.7 V.

When placed in the sun, photons in the sunlight can strike the bound electrons in the semiconductor, giving them more energy, a process known as "photo-excitation." In silicon, the minimum energy of a photon that can be absorbed and generates an electron hole pair is 1.12 eV. This value corresponds to the energy gap of silicon. A separation of charges occurs due to the electric field of the space charge region and leads to the generation of the photo-current. When a load is placed across the solar cell, the electrons flow and lose energy while moving through the external circuit. In such a manner, a photovoltaic cell can convert solar energy (sunlight) to electrical energy (electrical current).

Solar energy is multi-spectral light at about 1361 Watt/m$^2$ just outside the atmosphere of the Earth. The solar energy spectrum corresponds to a black body radiation of 5800 K. As this light passes through the atmosphere, gases in the atmosphere absorb part of the spectrum. The amount of light energy reaching the surface of earth depends on the geographic location, season and time of the day. A standard value of 1000 W/m$^2$ (Air Mass 1.5) is used for testing flat photovoltaic panels.

Solar radiation received from the sun can be perceived as a collection of light beams that are nearly parallel in nature. However, the sun is not a point source of light, which imposes a restriction on focusing optics of the photovoltaic system. When a finite size light beam is incident on a dispersive element, the light beam expands thereby overlapping the expanded beam of neighboring finite size beams. This imposes a restriction on placing a photovoltaic cell after the dispersive element. Further, allowing the beam to expand to a size much larger than its initial size reduces blurring. However, placing a photovoltaic cell to cover an expanded beam size drives up the system cost as more photovoltaic receivers are required to process the expanded light beam.

Furthermore, a physical limit governing the theoretical efficiency of a solar panel that uses a p-n junction to collect power from the cell is defined by Shockley-Queisser limit or detailed balance limit. The limit places maximum solar conversion efficiency around 33.7% assuming a single p-n junction with a band gap of 1.34 electron-volts. That is, of all the power contained in sunlight falling on an ideal solar cell (about 1000 W/m$^2$), only 33.7% of that could ever be turned into electricity (337 W/m$^2$). The losses are mainly due to the thermalization process of the carriers generated by light photons whose energy exceeds the energy gap of the semiconductor. In practice, additional losses occur as a result of the reflection off the front surface and light blockage from the thin wires on its surface.

Note that Shockley-Queisser limit only applies to cells with a single p-n junction. Cells with multiple layers can outperform this limit. In fact, one technique is to stack layers of different materials on top of each other (multi-junction) so that each layer absorbs part of the spectrum. This technology has allowed the fabrication of solar cells of power conversion efficiency exceeding the thermodynamic limit. However, layering and junctioning the solar cell is a complex process which results in high cost of the system.

In what follows, configurations of a single-junction photovoltaic system are described followed by a method performed by the photovoltaic systems to convert solar energy into electrical energy.

Figure 1:
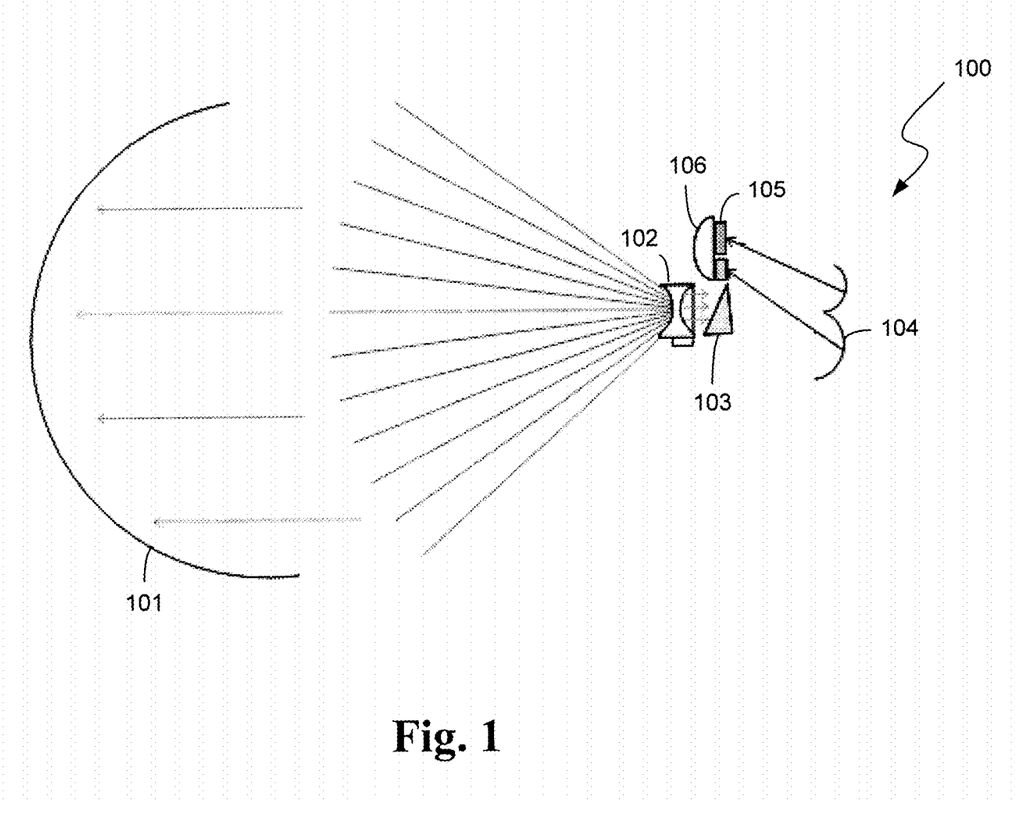
FIG. 1 illustrates a configuration of a photovoltaic system according to one embodiment.

FIG. 1 illustrates a first configuration of a photovoltaic system 100 according to one embodiment of the present disclosure.

The configuration 100 includes a spectral absorber (described below) positioned around a parabolic trough 101. The parabolic trough is a type of solar thermal collector that is straight in one dimension and curved as a parabola in the other two, lined with a polished metal mirror. The energy of sunlight which enters the mirror parallel to its plane of symmetry is focused along the focal line. The optics, cooling, photovoltaic cell, and the structural support for the system in integrated in a single pipe like structure as shown in FIG. 1. The focus line of the parabolic trough 101 is assumed to be in constant position and orientation with respect to the spectral absorber. The aligning of the focus line with respect to the parabolic trough can be performed by tracking. Specifically, a 1D tracking can be performed to ensure the alignment and the tracking can be performed either daily or seasonally.

The system includes a parabolic trough (primary reflective concentrator) 101 that concentrates the light into a single focus line. The parabolic trough accepts energy from the sun (solar energy) and focuses the energy at the focus line (wherein the absorber is positioned) in order to further convert into electrical energy.

Further, the solar light that is focused at the focal line is parallelized by a parallelizing element 102, such as refractive collimator or the like. A collimator is a device that narrows a light beam. Specifically, the collimator causes the directions of light to become more aligned in a specific direction (i.e., collimated or parallel) or to cause the spatial cross section of the beam to become smaller. The concentrated light converges (i.e., focuses) at a line then diverges (i.e., defocuses) from that line in a parallel form. Both refractive and reflective collimators can be used to parallelize the beam.

However, according to one embodiment, refractive lenses are preferred. The lenses could be either of concave type for pre-focus placement or convex type for post-focus placement. The refractive/reflective lens is made of a material that has a refractive index such that chromatic dispersion is minimized. Further, the refractive element 102 parallelizes the light beam based on the curvature of the lens and not the thickness of the lens. Thus, the thickness of the lens can be minimized.

The photovoltaic system includes a spectral dispersion element 103 such as a prism. The spectral dispersion element 103 is made of a material that has its index of refraction based on a function of operating frequency. After exiting the "prism", the light beam it diverges in an outward manner from the prism. The prism can have a triangular geometry. Triangular prisms can be used to disperse light, that is, to break light up into its spectral components (the colors of the rainbow). The dispersion occurs because the angle of refraction is dependent on the refractive index of a certain material, which in turn is slightly dependent on the wavelength of light that is travelling through it. Thus, different wavelengths of light may travel at different speeds, and so the light may get dispersed into the colors of the visible spectrum. For instance, with longer wavelengths (such as red, yellow) may get refracted less than shorter wavelengths (such as violet, blue).

Note that the focusing light is finite due to the finite size of the sun's beam on earth's surface. The angle of the sun is given by the following equation: 2 sin (θ)*r=2*sin (0.5 deg)*1 m=1.7 cm, wherein r=1 m is a focal distance according to one embodiment. The angle θ is the apparent angular size of the sun as seen from earth's surface. Upon focusing the parallel light into a line via trough of radius r, the smallest size of the focused beam is not zero. Rather, the smallest size of the focused beam is 2 sin (θ)*r. Further, each point from the collimated source of light will be dispersed into a spectrum or "rainbow". Each spectrum will overlap the spectrum of each other point source. Thus a blurring (point spreading) effect is produced due to finite source of light.

The dispersed spectrum or "rainbow" from each point will be blurred out by a factor that is based on the above computed distance. For instance, at a sufficient distance away from the backside of the dispersion element, the blurring will be low. For example by moving away around 17 cm then the blurring will reduce to 10%, whereas a distance of 8.5 cm behind the dispersion element, the blurring will reduce to 20%. Furthermore, the amount of blurring can also be considered as an optimization parameter in the photovoltaic system design, while maintaining a balance between the efficiency of the system and overall physical size of the photovoltaic system. According to another embodiment (described with reference to FIG. 2), the photovoltaic system design is made compact by incorporating several reflection processes. In doing so, note that the optical path of the light beam is increased without increasing the bulkiness (size) of the photovoltaic system.

The system includes a refocusing element 104, such as a reflective concentrator or the like. The refocusing element 104 reflects back the dispersed light into a smaller area of photovoltaic cell. The focusing could be implemented as a single reflector, a plurality of reflectors with possibly different sizes (that are configured to focus different energy bands into corresponding photovoltaic cells) or the like. According to an embodiment, the focusing ratio (defined as a ratio of the amount of light energy focused on a photovoltaic cell to the amount light incident on the reflecting element), could be set for different bands of energy for heat management and cost purposes.

The system 100 also includes single junction photovoltaic cells 105. The photovoltaic cell could be disposed on the on the backside of the dispersing element. However, the blurring effect is large such that there is not sufficient color resolving. Thus, some distance between the dispersion element and solar cells should be given to allow sufficient separation of colors.

Furthermore, the photovoltaic system 100 may include a cooling element 106. The cooling unit is important from an operational prospective to keep the photovoltaic cells at a relatively low operational temperature, in order to improve the efficiency of the photovoltaic system and moreover preserve the lifetime of the cell.

The cooling can be achieved as either 'active cooling', which is performed by passing a cooling fluid into an enclosure. The cooling fluid could be surrounded by an insulating layer. Further, depending on the temperature, the cooling flow can be configured so as to not gain heat from external atmosphere. According to another embodiment, the cooling can be achieved by using a heat sink with passive radiators and moreover, the secondary focusing (caused by the refocusing element 104), could be reduced to passively cool the photovoltaic cell 105.

The photovoltaic system 100, may also include a protective enclosure (not shown in diagram, for sake of clarity) to cover the optical elements and reflectors. That is, the protective enclosure could shield elements 102, 103, and possibly 104 from the environmental humidity and dust accumulation. A protective enclosure could also surround the optical element and serve as mechanical support, a heat radiator and the like.

Figure 2:
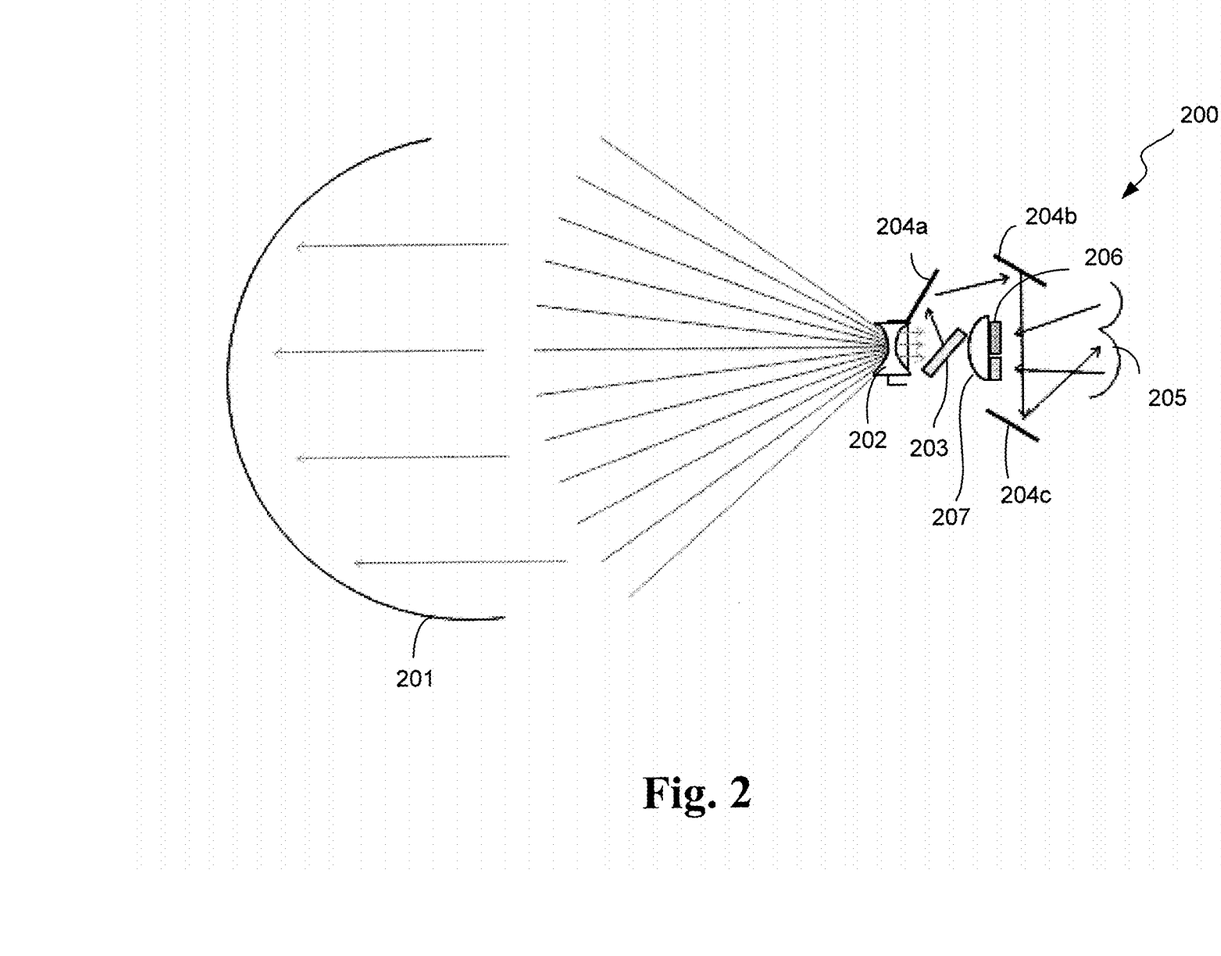
FIG. 2 illustrates another configuration of the photovoltaic system according to another embodiment.

FIG. 2 illustrates a second configuration 200 of the photovoltaic system according to another embodiment.

The photovoltaic system 200 includes a parabolic trough 201, a parallelizing element 202, such as refractive collimator or the like, a refocusing element 204, such as a reflective concentrator, a single junction photovoltaic cell 206 and a cooling element 207. These elements are similar to those as described in photovoltaic system of FIG. 1. Thus, a detailed description of these elements is not reiterated herein.

The photovoltaic system 200 of the present embodiment includes a grating 203 that is configured to operate as a dispersive element and a plurality of reflective mirrors 204a, 204b and 204c that are disposed in a manner as shown in FIG. 2.

The polychromatic collimated light emerging from the refractive collimator 202 is first passed to the grating 203 that spectrally separates the polychromatic light and directs it to the mirror 204a. The spectrally separated light is reflected from the mirrors 204a-204c and eventually directed to the reflective concentrator 205, which focuses the light beam on the photovoltaic cells 206. Thus, the photovoltaic system of the present embodiment incorporates a grating and a plurality of reflective mirrors to increase the optical path of light and make the overall system design more compact. Specifically, the optical path includes a reflection path from mirrors 204a-204c that eventually ends at the photovoltaic cell 206. If the same length of the optical path is directed from the grating 203 to the photovoltaic cell 206, in a straight (direct) path, then the overall system size is large and requires mechanical support. Thus, according to the present embodiment, the plurality of reflective mirrors makes the system compact.

Figure 3:
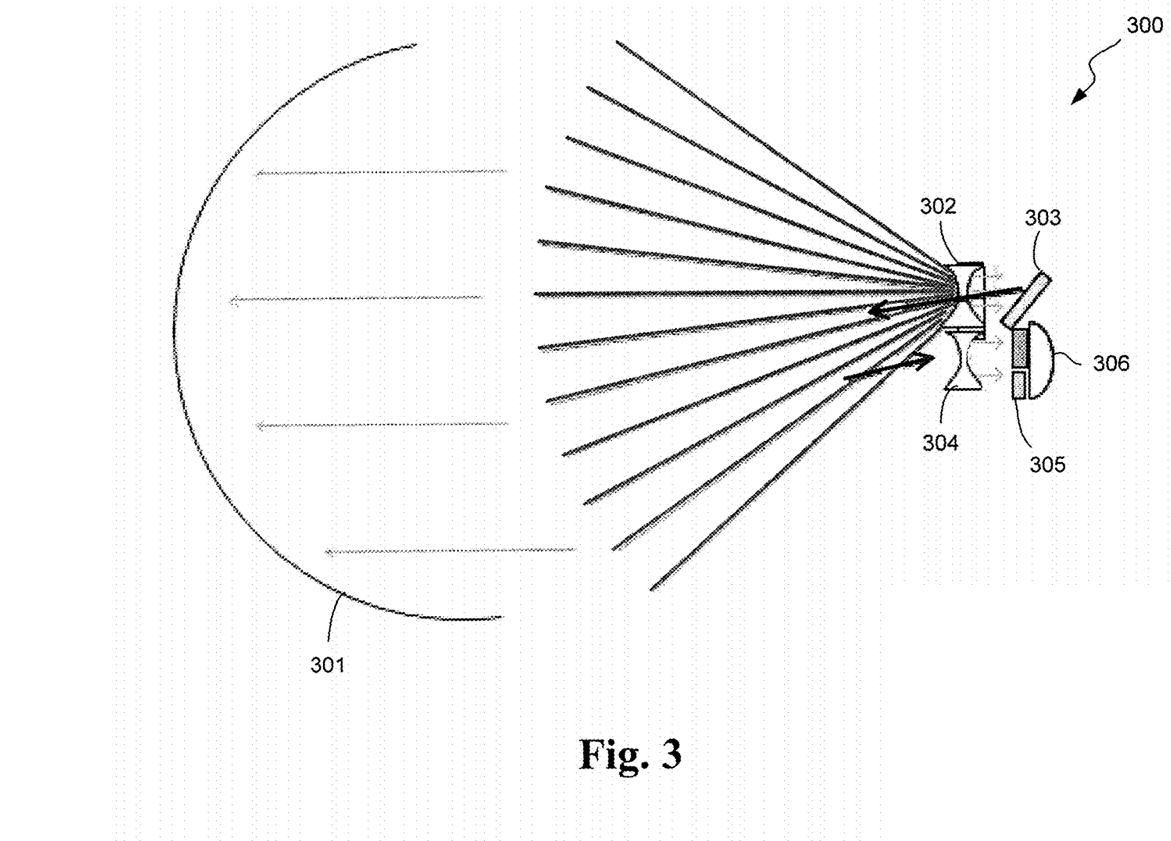
FIG. 3 illustrates another configuration of the photovoltaic system including a refractive grating according to another embodiment.

FIG. 3 illustrates another configuration of the photovoltaic system 300 including a refractive grating according to another embodiment.

The photovoltaic system of FIG. 3 includes a parabolic trough 301 which serves as a primary reflective concentrator, a first parallelizing element 302, such as refractive collimator or the like, a second parallelizing element 304 (such as refractive collimator), a single junction photovoltaic cell 305 and a cooling element 306. These elements are similar to those as described in photovoltaic system of FIG. 1 and FIG. 2. Thus, a detailed description of these elements is not reiterated herein.

In the photovoltaic system of the present embodiment, a refractive grating 303 is positioned at a predetermined distance behind the first refractive collimator 302. The light beam that is parallelized by the refractive collimator 302 is incident on the refractive grating 303. The grating 303 directs the light beam back to the parabolic trough 301 to expand the beam and thus reduce the blurring.

The color separated beam that is incident on the parabolic trough 301 is concentrated on the second parallelizing element (refractive collimator) 304, wherein after, the collimator 304 directs the light beam on the photovoltaic cell 305. The configuration of the photovoltaic system of FIG. 3 provides a significant advantage in reducing the blurring effect by reducing the blurring in the light beam by reflecting the light beam back to the parabolic trough. Furthermore, the photovoltaic system configuration 300 achieves reduced system bulkiness by avoiding the need for using a secondary reflector to direct the light beam towards the photovoltaic cell.

Figure 4:
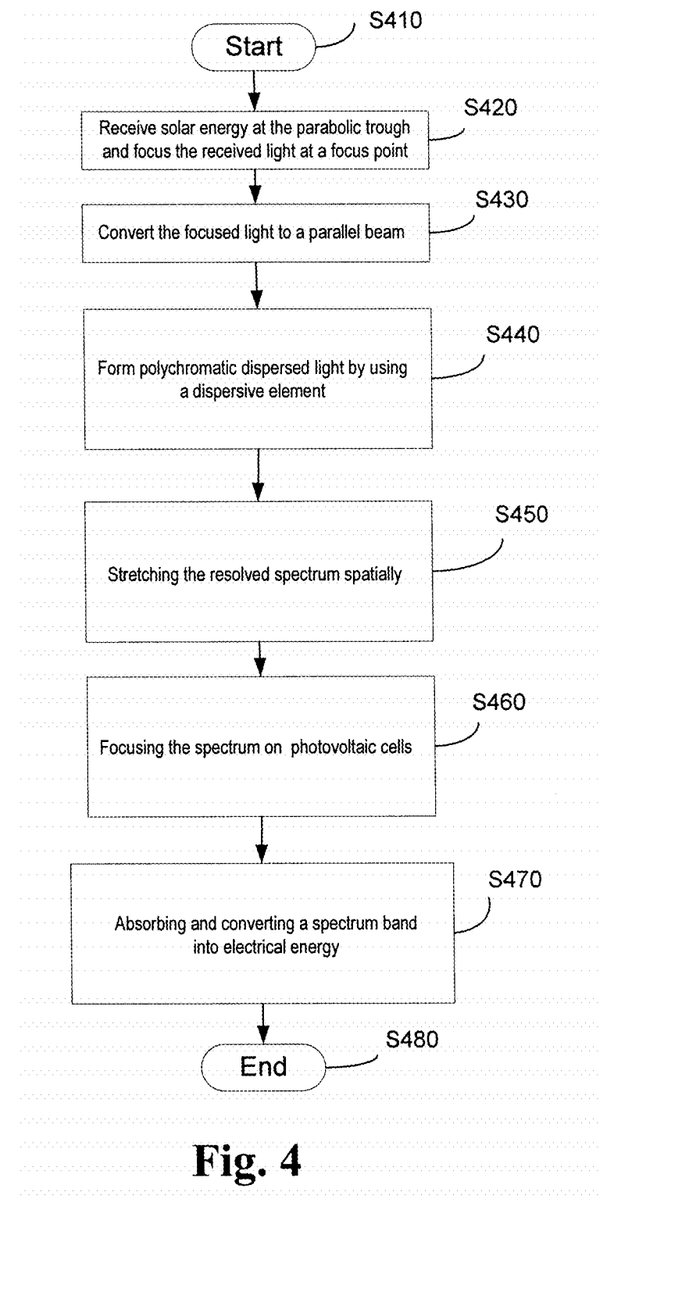
FIG. 4 depicts a flowchart illustrating the steps performed by the photovoltaic system.

FIG. 4 depicts a flowchart illustrating the steps performed by the photovoltaic system.

The process starts in step S410 and proceeds to step S420. In step S420, solar energy is received by a parabolic trough and the received light energy (i.e., solar light) is focused at a focus point of the parabolic trough.

In step S430, the focused light is converted into a parallel polychromatic light beam by a refractive collimator. In step S440, the polychromatic light is dispersed i.e., spectrally separated into constituent colors by a dispersive element. The dispersive element may be a prism, a grating or the like. Further, the dispersed light that diverges outwards from the dispersive element is blurred because of the finite size of the input light beam.

The process then moves to step S450, wherein the dispersed light is stretched spatially to reduce the effect of the beam size blurring. According to one embodiment of the present disclosure, the stretching of the light beam can be performed by using a plurality of reflective mirrors that are configured to elongate the optical path of the light by incorporating multiple reflections.

In step S460, specific bands (wavelengths) of the stretched spectrum are focused on a photovoltaic cell. The focusing can be performed for instance by using a reflective concentrator. The reflective concentrator reduces the cross sectional area of the stretched light beam. Further, the process in step S470, the photovoltaic cell converts the received light beam into electrical energy, where after the process simply ends in step S480.

The photovoltaic systems described above also produce a lower cost per Watt of solar energy. The cost per watt of solar energy produced by an amorphous silicon based photovoltaic system can be compared to a system using spatially resolved solar light (as described in the present embodiments) and both amorphous silicon (a-Si) and crystalline silicon (c-Si) devices.

The c-Si based system is used to absorb the lower energy part of the light spectrum (photon energy is less than 1.7 eV but greater than 1.12 eV) and a-Si based system is used to absorb the remaining part of the light spectrum (wherein photon energy is greater than 1.7 eV). It is observed that up to a 46% decrease in cost/Watt can be achieved by the photovoltaic system employing a resolved light spectrum. The assumption here is that the cost per watt of both a-Si and c-Si are identical. Thus, the solar light is resolved into a spectrum with exactly the input cross-sectional area. Furthermore, the splitting process is assumed lossless and its cost is ignored.

Aspects of the present disclosure describe above are in no way limited to the specific devices described therein. Variations of devices such as using a parabolic dish (2D concentration) can be used instead of a parabolic mirror. The parabolic dish has a reflective surface that is used to collect or project energy such as light, sound, or radio waves. The shape of the parabolic dish is of the form of a circular paraboloid, that is, the surface generated by a parabola revolving around its axis. Furthermore, the positioning and orientation of the optics such as the grating, collimator, and reflective mirrors can be controlled by a microcontroller, processor, a general purpose computer or the like. In what follows, a description is provided of a computing device that may be configured to control the operation of the optic devices described herein.

Figure 5:
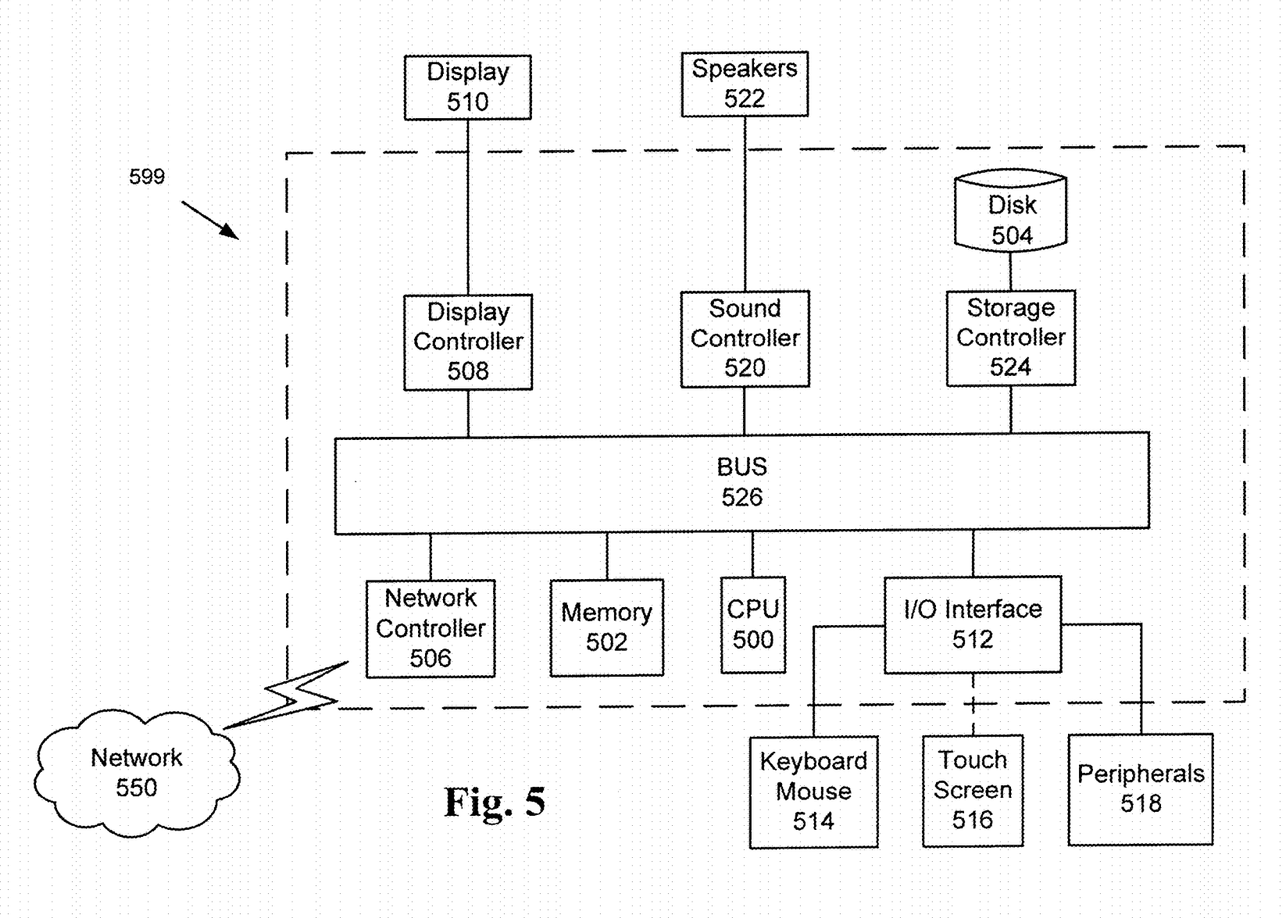
FIG. 5 illustrates a block diagram of a computing device according to an embodiment.

FIG. 5 illustrates a block diagram of a computing device according to an embodiment. In FIG. 5, the computer 599 includes a CPU 500 which performs the processes described above. The process data and instructions may be stored in memory 502. These processes and instructions may also be stored on a storage medium disk 304 such as a hard disk drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the system communicates, such as a server or computer.

Further, the claimed advancements may be provided as a utility application, background daemon, or component of an operating system, or combination thereof, executing in conjunction with CPU 500 and an operating system such as Microsoft Windows 7, UNIX, Solaris, LINUX, Apple MAC-OS and other systems known to those skilled in the art.

CPU 500 may be a Xenon or Core processor from Intel of America or an Opteron processor from AMD of America, or may be other processor types that would be recognized by one of ordinary skill in the art. Alternatively, the CPU 500 may be implemented on an FPGA, ASIC, PLD or using discrete logic circuits, as one of ordinary skill in the art would recognize. Further, CPU 500 may be implemented as multiple processors cooperatively working in parallel to perform the instructions of the inventive processes described above.

The computer 599 in FIG. 5 also includes a network controller 506, such as an Intel Ethernet PRO network interface card from Intel Corporation of America, for interfacing with network 550. As can be appreciated, the network 550 can be a public network, such as the Internet, or a private network such as an LAN or WAN network, or any combination thereof and can also include PSTN or ISDN sub-networks. The network 550 can also be wired, such as an Ethernet network, or can be wireless such as a cellular network including EDGE, 3G and 4G wireless cellular systems. The wireless network can also be WiFi, Bluetooth, or any other wireless form of communication that is known.

The computer 599 further includes a display controller 508, such as a NVIDIA GeForce GTX or Quadro graphics adaptor from NVIDIA Corporation of America for interfacing with display 510, such as a Hewlett Packard HPL2445w LCD monitor. A general purpose I/O interface 512 interfaces with a keyboard and/or mouse 514 as well as a touch screen panel 516 on or separate from display 510. General purpose I/O interface also connects to a variety of peripherals 518 including printers and scanners, such as an OfficeJet or DeskJet from Hewlett Packard.

A sound controller 520 may also be provided in the computer 599, such as Sound Blaster X-Fi Titanium from Creative, to interface with speakers/microphone 522 thereby providing sounds and/or music. The speakers/microphone 522 can also be used to accept dictated words as commands for controlling the robot-guided medical procedure system or for providing location and/or property information with respect to the target property.

The general purpose storage controller 524 connects the storage medium disk 304 with communication bus 526, which may be an ISA, EISA, VESA, PCI, or similar, for interconnecting all of the components of the robot-guided medical procedure system. A description of the general features and functionality of the display 510, keyboard and/or mouse 514, as well as the display controller 508, storage controller 524, network controller 506, sound controller 520, and general purpose I/O interface 512 is omitted herein for brevity as these features are known.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

The invention claimed is:

1. A photovoltaic system comprising:
   a concentrator configured to receive an incident light and focus the incident light into a focused light at a focus point of the concentrator;
   a collimator configured to convert the focused light into a parallel beam of light;
   a dispersive optic configured to spectrally split the parallel beam of light into constituent colors, wherein a first side of the dispersive optic is in a plane perpendicular to a direction of the parallel beam of light and a second side of the dispersive optic is parallel to the direction of the parallel beam of light and the collimator is positioned between the concentrator and the dispersive optic;
   a reflector configured to re-focus the constituent colors into re-focused constituent color, wherein the reflector is positioned at a first predetermined distance from the first side of the dispersive optic and the dispersive optic is positioned between the collimator and the reflector; and
   a single-junction photovoltaic cell configured to absorb one of the re-focused constituent colors, and convert the one of the re-focused constituent colors into electrical energy, wherein the collimator is positioned at the focus point of the concentrator, the dispersive optic is positioned at a second predetermined distance from the collimator, wherein the single-junction photovoltaic cell is positioned at a third predetermined distance beside the dispersive optic and between the collimator and the reflector, and wherein a surface of the single-junction photovoltaic cell is in the plane perpendicular to the direction of the parallel beam of light.

2. The photovoltaic system of claim 1, wherein the concentrator is one of a parabolic trough and a parabolic dish.

3. The photovoltaic system of claim 1, wherein the collimator is one of a concave refractive collimator and a convex refractive collimator.

4. The photovoltaic system of claim 1, wherein the reflector includes a plurality of sub-reflectors, and each sub-reflector of the plurality of sub-reflectors has a predetermined size and is configured to re-focus the one of the constituent colors onto the single-junction photovoltaic cell.

5. The photovoltaic system of claim 1, further comprising:
   a cooler configured to maintain the single-junction photovoltaic cell at a predetermined operating temperature, by circulating a cooling fluid in an enclosure surrounding the single-junction photovoltaic cell.

6. The photovoltaic system of claim 1, further comprising:
   a protective enclosure configured to shield at least one of the collimator and the dispersive optic from environmental humidity and dust accumulation.

7. The photovoltaic system of claim 1, wherein the dispersive optic is a prism.

8. A method of photovoltaic energy conversion, the method comprising:
   receiving an incident light from a light source and focusing the incident light into a focused light by a concentrator at a focus point of the concentrator;
   converting the focused light into a parallel beam of light by a collimator;
   splitting spectrally the parallel beam of light into constituent colors by a dispersive optic, wherein a first side of the dispersive optic is in a plane perpendicular to a direction of the parallel beam of light and a second side of the dispersive optic is parallel to the direction of the parallel beam of light and the collimator is positioned between the concentrator and the dispersive optic;
   re-focusing the constituent colors into re-focused constituent colors by a reflector, wherein the reflector is positioned at a first predetermined distance from the first side of the dispersive optic and the dispersive optic is positioned between the collimator and the reflector; and
   absorbing one of the re-focused constituent colors, and converting the one of the re-focused constituent colors into electrical energy by a single-junction photovoltaic cell, wherein the collimator is positioned at the focus point of the concentrator, the dispersive optic is positioned at a second predetermined distance in front of the collimator, wherein the single-junction photovoltaic cell is positioned at a third predetermined distance beside above the dispersive optic and between the collimator and the reflector, and wherein a surface of the single-junction photovoltaic cell is in the plane perpendicular to the direction of the parallel beam of light.

9. The method of claim 8, further comprising:
   cooling the single-junction photovoltaic cell at a predetermined operating temperature by a cooler, by circulating a cooling fluid in an enclosure surrounding the single-junction photovoltaic cell.

10. The method of claim 8, further comprising:
    shielding at least one of the collimator and the dispersive optic from environmental humidity and dust accumulation by a protective enclosure.

* * * * *